United States Patent
Okada et al.

(10) Patent No.: US 6,930,023 B2
(45) Date of Patent: Aug. 16, 2005

(54) SEMICONDUCTOR WAFER THINNING METHOD, AND THIN SEMICONDUCTOR WAFER

(75) Inventors: Mamoru Okada, Nagano (JP); Yukio Nakajima, Nagano (JP)

(73) Assignee: Shin-Etsu Handotai Co, Ltd., Tokyo (JP)

( * ) Notice: Subject to any disclaimer, the term of this patent is extended or adjusted under 35 U.S.C. 154(b) by 0 days.

(21) Appl. No.: 10/276,537

(22) PCT Filed: May 11, 2001

(86) PCT No.: PCT/JP01/03947

§ 371 (c)(1),
(2), (4) Date: Nov. 15, 2002

(87) PCT Pub. No.: WO01/88970

PCT Pub. Date: Nov. 22, 2001

(65) Prior Publication Data

US 2003/0113984 A1 Jun. 19, 2003

(30) Foreign Application Priority Data

May 16, 2000 (JP) ........................................ 2000-143043

(51) Int. Cl.⁷ .............................................. H01L 21/46
(52) U.S. Cl. ...................... 438/459; 438/977; 438/928; 438/959
(58) Field of Search ................................ 438/459, 977, 438/928, 959

(56) References Cited

U.S. PATENT DOCUMENTS 5,476,566 A * 12/1995 Cavasin ...................... 156/249
6,391,679 B1 * 5/2002 Anker et al. ................. 438/106
6,398,892 B1 * 6/2002 Noguchi et al. .............. 156/85
6,506,664 B1 * 1/2003 Beyne et al. ................ 438/455

FOREIGN PATENT DOCUMENTS

| JP | 05-218196 | 8/1993 |
| JP | 08-037169 | 2/1996 |
| JP | 09-148283 | 6/1997 |
| JP | 11-238710 | 8/1999 |
| JP | 11-297650 | 10/1999 |
| JP | 2000-003892 | 1/2000 |
| JP | 2000-087004 | 3/2000 |
| WO | WO 99/25019 | 5/1999 |

* cited by examiner

*Primary Examiner*—Amir Zarabian
*Assistant Examiner*—Christy Novacek
(74) *Attorney, Agent, or Firm*—Hogan & Hartson, LLP

(57) ABSTRACT

In a method for thinning a semiconductor wafer by grinding a back surface of the semiconductor wafer in which semiconductor devices 2 are formed on its surface, the surface of the semiconductor wafer 1 is adhered to a support 4 via an adhesive layer 3, the back surface of the semiconductor wafer is ground while holding the support, and then the thinned semiconductor wafer is released from the support. Preferably, a semiconductor wafer is used as the support, a thermal release double-sided adhesive sheet is used as the adhesive layer, and they are separated by heating after grinding. Thus, there are provided a method for thinning a semiconductor wafer, which enables production of semiconductor wafers having a thickness of about 120 μm or less without generating breakage such as cracking or chipping during the processing step and so forth as much as possible at a low cost, and a semiconductor wafer thinned further compared with conventional products in spite of a large diameter of 6 inches (150 mm) or more.

6 Claims, 2 Drawing Sheets

SEMICONDUCTOR WAFER THINNING METHOD, AND THIN SEMICONDUCTOR WAFER

TECHNICAL FIELD

The present invention relates to a method for thinning a semiconductor wafer, which is a method for making a semiconductor wafer into a thin semiconductor wafer suitable for producing, for example, semiconductor devices such as IC cards, solar cells and thin film transistors or semiconductor integrated circuits (IC) consisting of multiple semiconductor devices.

BACKGROUND ART

In the production of semiconductor devices such as IC cards, solar cells and thin film transistors or semiconductor integrated circuits, miniaturization of devices or degree of freedom concerning use thereof can be improved by making thickness of semiconductor wafers used as substrates therefor sufficiently thinner.

In particular, for IC cards and so forth, necessity for thinning semiconductor wafer is high, and it is desired that chips constituting circuits should be made thinner as much as possible.

In a conventional technique, in order to produce such a thin semiconductor wafer, semiconductor devices (circuit patterns) are formed on a surface of a mirror-polished semiconductor wafer having such a usual thickness as described later, then a protective tape is adhered on the surface, the wafer is placed on a chuck table of grinding apparatus with the surface side as the underside, and the back surface is ground with a grinding stone to thin the wafer (see, for example, Japanese Patent Laid-open (Kokai) Publication No. 5-218196 and 8-37169).

The aforementioned usual thickness of semiconductor wafer generally varies depending on its diameter and, for example, it is about 625 $\mu$m for a wafer having a diameter of 5 inches (125 mm) or 6 inches (150 mm) or about 725 $\mu$m for a wafer having a diameter of 8 inches (200 mm). And although the thickness after thinning may vary depending on types of semiconductor devices to be produced, it is generally about 150–400 $\mu$m. If it is attempted to thin wafers further thinner by using the aforementioned conventional technique, the probability of breakage of the wafer during the processing step or upon peeling of the protective tape becomes high, and therefore it is extremely difficult to use it for large scale production.

However, semiconductor devices used for IC cards and so forth are required to have increasingly various functions in recent years. Under such a situation, necessity of thinning semiconductor wafers to be used further thinner has become higher, and it has become necessary to make them thinner to a thickness of about 120 $\mu$m or smaller.

If the conventional method for thinning wafers is used in order to produce such an extremely thin semiconductor wafers, frequency of breakage such as cracking or chipping during the processing step and so forth becomes higher as described above. Therefore, yield is degraded and cost is increased. As a result, it cannot meet large scale production. That is, if it is attempted to obtain a thickness of 120 $\mu$m or less by the conventional technique, it is substantially impossible to prevent cracking unless a wafer having a diameter of 4 inches (100 mm) or less is used.

DISCLOSURE OF THE INVENTION

The present invention was accomplished in view of the aforementioned problems, and its object is to provide a method for thinning a semiconductor wafer, which enables production of semiconductor wafers having a thickness of about 120 $\mu$m or less without generating breakage such as cracking or chipping during the processing step and so forth as much as possible at a low cost, and a semiconductor wafer, in particular, one produced in a large scale production to have a diameter of 6 inches or more, made further thinner compared with conventional products.

In order to achieve the aforementioned object, the present invention provides a method for thinning a semiconductor wafer by grinding a back surface of a semiconductor wafer in which semiconductor devices are formed on its surface, which comprises adhering the surface of the semiconductor wafer to a support via an adhesive layer, grinding the back surface of the semiconductor wafer while holding the support, and then releasing the thinned semiconductor wafer from the support.

That is, when semiconductor devices are formed on a surface of semiconductor wafer and then the thickness of the wafer is made further thinner, if the wafer is adhered to a support via an adhesive layer and the back surface of the wafer is ground as described above, the wafer can be thinned thinner compared with conventional products without causing breakage during the processing step, and then by releasing the thinned wafer from the support, a thin semiconductor wafer that can be used for IC cards and so forth can be obtained.

In this case, the aforementioned support preferably consists of a semiconductor wafer, a glass substrate or a ceramic substrate.

If a semiconductor wafer is ground by using such a support, a thin and extremely flat semiconductor wafer can be obtained. In particular, if a semiconductor wafer composed of the same material as the semiconductor wafer to be thinned is used, they have the same physical properties such as rigidity, and the wafer to be ground and the wafer used as the support show no difference in coefficient of thermal expansion. Thus, even if heat is generated during the grinding, grinding can be performed without generating any stress.

The aforementioned adhesive layer preferably comprises wax or thermal release adhesive, and it particularly preferably consists of a thermal release double-sided adhesive sheet.

If an adhesive layer that can be melted or released by heating is used as described above, after the grinding, the thinned semiconductor wafer can be easily released from the support by heating without breakage.

Further, when a thermal release double-sided adhesive sheet is used as the adhesive layer, if one showing different thermal release temperatures for the both surfaces is used, only a semiconductor wafer made thinner can be easily separated from the adhesive sheet by heating.

Further, in the present invention, the adhesive surface of the support preferably has an area larger than the surface of the aforementioned semiconductor wafer.

By using a support having a larger adhesive surface as described above, the whole surface of the semiconductor wafer including the outermost peripheral portion can be easily and surely adhered to the support.

In the present invention, a semiconductor wafer in which semiconductor devices are formed on its surface can be ground to a thickness of 120 $\mu$m or less according to the aforementioned method.

That is, by grinding the semiconductor wafer adhered to the support via the adhesive layer, the wafer can be made further thinner compared with the conventional method and the wafer can be ground to a thickness of 120 μm or less without causing breakage of the wafer.

Also, the present invention further provides a semiconductor wafer thinned by the aforementioned method. Specifically, there can be obtained a semiconductor wafer having a diameter of 6 inches or more and a thickness of 120 μm or less.

A thickness that could not have been substantially obtained by the conventional technique unless the diameter was 4 inches or less has been achieved for a diameter of 6 inches or more for the first time. Such an extremely thin wafer can suitably be used for IC cards and so forth.

As explained above, according to the present invention, by adhering the surface of the semiconductor wafer on which semiconductor devices are formed to a support via an adhesive layer, grinding the back surface of the wafer, and in particular, using a thermal release adhesive layer as the adhesive layer, the semiconductor wafer can be easily released by heating after grinding. Therefore, the semiconductor wafer can be thinned further thinner co pared with the conventional technique without causing breakage such as cranking or chipping during the grinding step or releasing step, and a semiconductor wafer having a thickness of about 120 μm or less can be obtained at low cost.

BEST MODE FOR CARRYING OUT THE INVENTION

Hereafter, embodiments of the present invention will be specifically explained with reference to the drawings. However, the present invention is not limited to these.

Figure 1:
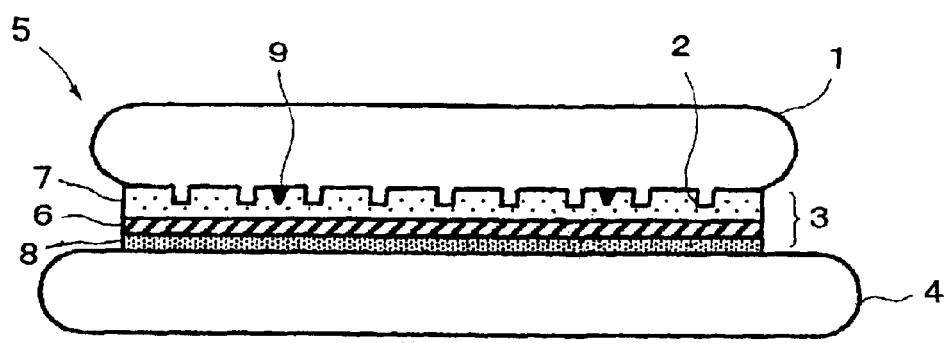
FIG. 1 is a typical view showing a cross section of a semiconductor wafer to be thinned according to the present invention, which is adhered to a support.
Figure 2:
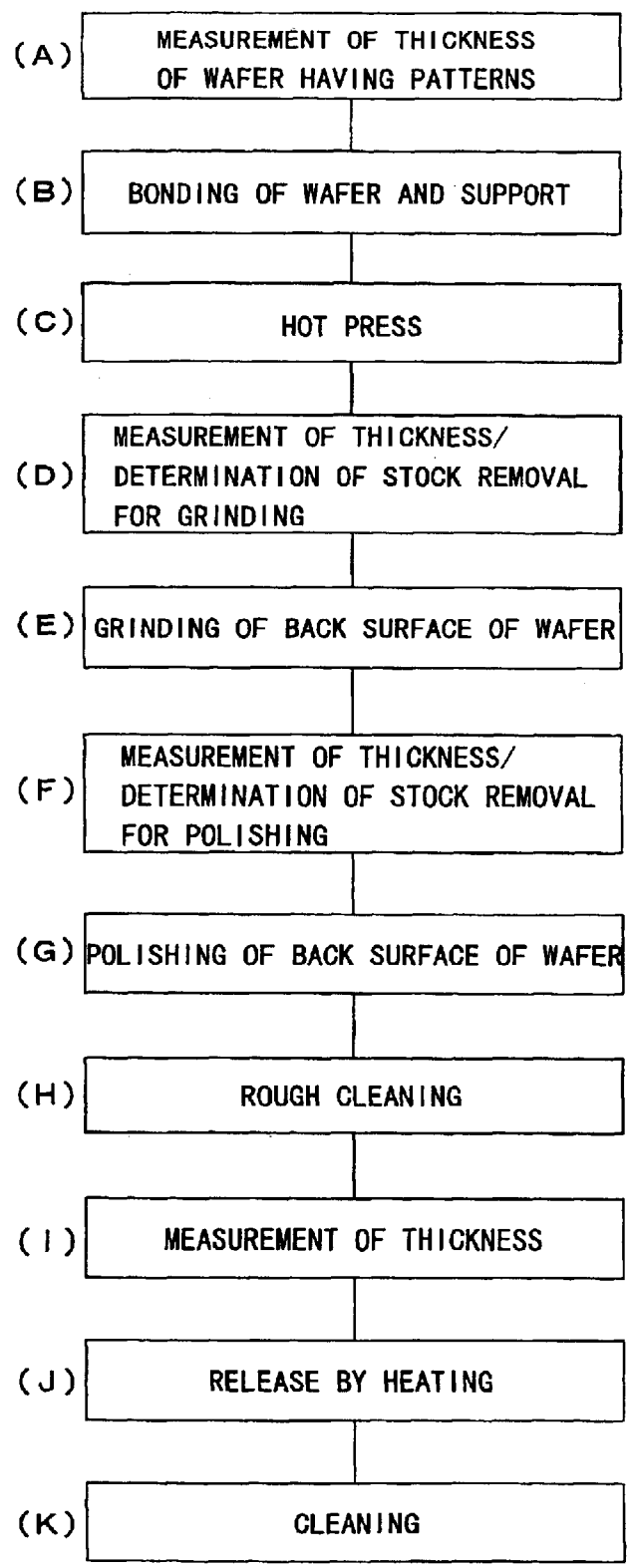
FIG. 2 is a flow diagram showing exemplary steps for thinning semiconductor wafer according to the present invention.

FIG. 1 is a typical view showing a cross section of a semiconductor wafer to be thinned according to the present invention, which is adhered to a support via an adhesive layer. FIG. 2 is a flow diagram showing exemplary steps for thinning semiconductor wafer according to the present invention.

A semiconductor wafer to be thinned according to the present invention is one obtained by slicing an ingot, successively subjecting it to chamfering, furthermore, polishing and so forth, forming, for example, an oxide film on one side of mirror-polished surfaces thereof and then forming semiconductor devices (circuit patterns) on the surface by a photolithography technique. In the present invention, the surface on which semiconductor devices are formed as described above may be called surface of the wafer, and a semiconductor wafer on which semiconductor devices are formed as described above may be called a wafer having patterns or semiconductor wafer, or just called wafer.

In the present invention, as shown in FIG. 1, a surface of a semiconductor wafer 1 on which semiconductor devices 2 are formed is adhered to a support 4 via an adhesive layer 3.

Material of the support 4 is not particularly limited so long as it is in a thin plate shape and composed of a hard material, and there can be used, for example, a glass substrate, a ceramic substrate or a semiconductor wafer such as a silicon wafer (it may be one with an oxide film). In particular, if a semiconductor wafer composed of the same material as the semiconductor wafer 1 to be ground is used as the support 4, it has the same physical properties such as rigidity, and hence it shows no difference in coefficient of thermal expansion with respect to the wafer 1 to be ground. Thus, even if heat is generated during the grinding, stress to be generated can be minimized, and possibility of causing cracking is reduced. The use of the same material also provides an advantage of no fear that it becomes impurity.

As for the adhesive surface of the support 4, it is preferable to use a support 4 larger than the surface of the aforementioned wafer 1 having patterns. If the adhesive surface of the support 4 is large as described above, the whole surface of the wafer 1 having patterns can be easily and surely adhered to the support 4. In a wafer peripheral portion having a chamfered portion, in particular, adhesion is likely to become insufficient. However, if a large support is used, such a phenomenon can be prevented. Further, even if the position of the center portion of wafer 1 is somewhat deviated, there will not remain a portion not adhered and the whole wafer can surely and evenly be thinned. In addition, the operation time can be shortened and thus the operation for thinning the wafer 1 can be efficiently performed.

Further, the adhesive layer 3 is not particularly limited so long as it is not released during the grinding process and can be easily released after the grinding. However, it is preferably composed of a material that can be released by heating. As such a material that can be released by heating, there can be used, for example, wax, thermal release adhesive or a thermally releasable double-sided adhesive sheet. In particular, a thermal release double-sided adhesive sheet can be easily handled and shows superior uniformity, and therefore it enables extremely uniform grinding of wafer. The thermally releasable material is not particularly limited to a double-sided adhesive sheet, but a double-sided adhesive tape and so forth can also be used.

However, when a thermal release double-sided adhesive sheet or the like that is released by heating is used as described above, one that is not released by heat to be generated during the grinding must be selected and the grinding condition must be selected so as not to cause release.

Further, a part of the semiconductor devices 2 on the semiconductor wafer surface may be given a bad mark 9 that indicates failure. However, if a thermal release double-sided adhesive sheet 3 is used as described above, it can be easily released and the adhesive layer does not remain on the wafer surface after thermal release. Therefore, there is no necessity for cleaning and the bad mark 9 is not vanished.

The steps for thinning a wafer according to the present invention will be explained below. First, the thickness of the wafer 1 having patterns is measured by using a micrometer or the like (FIG. 2(A)), and then the wafer having patterns 1 and the support 4 are adhered to each other via the adhesive layer 3 to integrate them and thereby obtain a bonded composite 5 (FIG. 2(B)). Although the process for the bonding is not particularly limited, the bonded composite 5 can be easily obtained by applying the adhesive layer 3 on the surface of the wafer having patterns 1 and then adhering the wafer to the support 4 via the adhesive layer 3. In addition, in order to enhance the adhesive strength so that release should not be caused during the grinding step, if required, the bonded composite can be subjected to hot press at a temperature lower than the release temperature of the adhesive layer 3 and left for several minutes to several tens of hours to ensure the integration (FIG. 2(C)).

Then, the thickness of the bonded composite 5 is measured to determine a stock removal for grinding (FIG. 2(D)), and then the back surface of the wafer having patterns 1 is ground by using a grinding apparatus (FIG. 2(E)). As the grinding apparatus, a surface grinding machine usually used for grinding of one surface of wafer and so forth can be used. For example, the support side of the bonded composite 5 is fixed on a chuck table by vacuum suction or the like, and surface grinding of the back surface of the wafer 1 is performed by using a rotary grinding stone or the like.

As for the wafer 1 ground as described above, its back surface may further be polished as required (FIG. 2(G)). Also in such a case, a usual polishing apparatus for semiconductor wafers can be used, and the thickness of the bonded composite 5 can be measured beforehand to determine the stock removal for polishing (FIG. 2(F)).

When a thermal release double-sided adhesive sheet or the like is used, conditions including supplying amount of grinding fluid (coolant), grinding stone rotation number, grinding stone feeding speed and so forth can be suitably selected in order to prevent release due to the heat generation during grinding or polishing as described above.

After the grinding, the bonded composite is further subjected to polishing as required and then roughly cleaned (FIG. 2(H)), and the thickness of the bonded composite is measured (FIG. 2(I)). If it is necessary to be further made thinner, the thickness may be adjusted by subjecting the composite to grinding or polishing again. Thus, even a wafer having a diameter of 6 to 8 inches, for example, can be made to have a thickness of 120 μm or less without breakage.

After the wafer 1 is thinned to a desired thickness as described above, the wafer 1 is released from the support 4 (FIG. 2(J)). While the method for the release may differ depending on the used adhesive layer 3, if wax, thermal release adhesive or thermal release double-sided adhesive sheet is used as described above, the release can be easily attained by immersing the composite in a solution dissolving those materials or heating it to the thermal release temperature thereof. In the case of the thermal release double-sided adhesive sheet 3, in particular, one showing different thermal release temperatures for the surfaces of the both sides of the base material 6 or one showing different adhesive strength for the both surfaces at a high temperature can be used. In such a case, for example, a surface showing a higher thermal release temperature (high temperature thermal release surface) 8 can be adhered to the support 4, and a surface showing a lower thermal release temperature (low temperature thermal release surface) 7 can be adhered to the wafer having patterns 1. By doing so, the thinned wafer 1 can be released by heating while the double-sided adhesive sheet 3 remains to be adhered to the support.

Although the thinned wafer 1 becomes likely to suffer from breakage with a small stress, since the wafer 1 can be released only by heating as described above, there is substantially no possibility of generating cracking or chipping.

When wax or thermal release adhesive is used as adhesive layer, such an adhesive layer may remain on the surface of the wafer released by heating. Therefore, the wafer is subjected to cleaning using a cleaning solution or pure water, as required (FIG. 2(K)). On the other hand, when a thermal release double-sided adhesive sheet is used, an adhesive or the like hardly remains on the wafer surface, and therefore the cleaning may be omitted and thus there is no fear of breakage during the cleaning step. The support after the thermal release of the wafer, on which the double-sided adhesive sheet remains to be adhered, can be repeatedly used as it is by adhering a new wafer to be thinned to it. However, the sheet may be separated also from the support, the support may be cleaned, and a new double-sided adhesive sheet may be used for every wafer to be ground.

By performing the thinning according to the steps explained above, a semiconductor wafer can be thinned further to a thickness of about 120 μm or less without causing breakage such as cracking or chipping during the grinding step or releasing step, and there can be obtained a semiconductor wafer made further thinner compared with one produced by the conventional technique at a low cost.

The present invention will be explained more specifically with reference to the following examples. However, the present invention is not limited to these.

EXAMPLES

A surface of a 6-inch (150 mm) silicon wafer in which semiconductor devices are formed on its surface (wafer having patterns) was adhered to a surface of a silicon wafer via a thermal release double-sided adhesive sheet to form a bonded composite. Then, the back surface of the wafer having patterns was subjected to surface grinding by using a surface grinding machine so that the wafer should have a thickness of 105±15 μm. Subsequently, the wafer was released by heating and its thickness was measured. The thickness of the wafer before the grinding and the thickness of the wafer thinned by the grinding are shown in Table 1. As for the grinding conditions, a grinding stone of #2000 STD was used, and grinding stone rotation number: 5000 rpm and grinding stone feeding speed: 0.4 μm/min were used. As the thermal release double-sided adhesive sheet, REVALPHA produced by NITTO DENKO CORP. (thickness of base material: 50 μm, thermal release temperature: 120° C.) was used.

TABLE 1

| | Thickness of wafer having patterns (μm) | | | |
|---|---|---|---|---|
| | Before processing | | After processing | |
| Bad mark | Absent | Present | Absent | Present |
| No. 1 | 623.6 | 621.9 | 95.2 | 94.1 |
| No. 2 | 622.4 | 621.8 | 99.3 | 97.2 |
| No. 3 | 622.9 | 622.1 | 98.8 | 96.8 |
| No. 4 | 622.6 | 621.4 | 95.6 | 93.8 |
| No. 5 | 622.6 | 621.4 | 96.6 | 95.3 |
| No. 6 | 623.2 | — | 97.7 | — |
| No. 7 | 623.2 | — | 95.8 | — |
| No. 8 | 623.0 | — | 94.3 | — |
| No. 9 | 622.5 | — | 95.2 | — |
| Average | 622.9 | 621.7 | 96.5 | 95.4 |
| Range | 1.2 | 0.7 | 5.0 | 3.4 |

As clearly seen from the results shown in the aforementioned Table 1, each of the wafers having patterns after the grinding had a thickness in the specified range (105±15 μm), and they could be thinned to a thickness of 120 μm or less, in particular, 100 μm or less, without causing cracking, chipping or the like. Further, after the thermal release, it was not necessary to clean the wafers and bad marks remained as they were.

The present invention is not limited to the embodiments described above. The above-described embodiments are mere examples, and those having the substantially same structure as that described in the appended claims and providing similar functions and advantages are included in the scope of the present invention.

For example, the process steps of thinning explained in the aforementioned embodiments are mere examples, and a part of the steps may be omitted or exchanged, or further steps may be added. For example, the steps of (C) hot press, (F) thickness measurement/determination of stock removal for polishing, (G) polishing of wafer back surface and so forth are optional steps, and if a thermal release double-sided adhesive sheet is used as the adhesive layer, (K) cleaning may also be omitted.

Further, although 6-inch wafers having patterns were thinned by grinding in the examples, the present invention can also be applied to thinning those having a diameter larger than 6 inches, i.e., 8 inches or more, besides thinning those having a diameter of less than 6 inches as a matter of course.

What is claimed is:

1. A method for thinning a semiconductor wafer by grinding a back surface of the semiconductor wafer in which semiconductor devices are formed on an opposite surface, which comprises adhering the opposite surface of the semiconductor wafer on which the semiconductor devices are formed to a support via an adhesive layer which consists of thermal release double-sided adhesive sheet or thermal release double-sided adhesive tape showing different thermal release temperatures for both surfaces, grinding the back surface of the semiconductor wafer while holding the support, and then releasing the thinned semiconductor wafer from the support only by heating.

2. The method for thinning a semiconductor wafer according to claim 1, wherein the support consists of a semiconductor wafer, a glass substrate or a ceramic substrate.

3. The method for thinning a semiconductor wafer according to claim 1, wherein the adhesive layer consists of a thermal release double-sided adhesive sheet.

4. The method for thinning a semiconductor wafer according to claim 1, wherein a surface of the support to which the semiconductor wafer is to be adhered is larger than the opposite surface of the semiconductor wafer.

5. The method for thinning a semiconductor wafer according to claim 2, wherein a surface of the support to which the semiconductor wafer is to be adhered is larger than the opposite surface of the semiconductor wafer.

6. The method for thinning a semiconductor wafer according to claim 1, wherein the semiconductor wafer in which semiconductor devices are formed on its surface is ground to a thickness of 120 $\mu$m or less.

* * * * *